United States Patent [19]
Ura et al.

[11] 4,100,310
[45] Jul. 11, 1978

[54] METHOD OF DOPING INPURITIES

[75] Inventors: Mitsuru Ura; Takuzo Ogawa; Takaya Suzuki, all of Hitachi; Yosuke Inoue, Tokai; Masayoshi Nomura, Hachioji, all of Japan

[73] Assignee: Hitachi, Ltd., Japan

[21] Appl. No.: 648,943

[22] Filed: Jan. 14, 1976

[30] Foreign Application Priority Data

Jan. 20, 1975 [JP] Japan .................................. 50/7754

[51] Int. Cl.² ........................................... B05D 5/12
[52] U.S. Cl. ............................................ 427/8; 118/7; 427/85; 427/86; 427/95; 427/248 A; 427/248 B; 427/248 C
[58] Field of Search ............... 427/85, 86, 95, 8, 10, 427/248 A, 248 B, 248 C; 118/7, 48, 49, 49.1, 49.5; 148/174, 175

[56] References Cited

U.S. PATENT DOCUMENTS

| | | | |
|---|---|---|---|
| 3,370,995 | 2/1968 | Lowery et al. | 427/248 B |
| 3,419,718 | 12/1968 | Hammond et al. | 118/7 |
| 3,434,203 | 3/1969 | Thorp | 427/85 |
| 3,481,781 | 12/1969 | Kern | 427/95 |
| 3,576,670 | 4/1971 | Hammond | 427/62 |
| 3,682,699 | 8/1972 | Koga et al. | 148/175 |
| 3,919,968 | 11/1975 | Sandmann et al. | 118/7 |
| 3,924,024 | 12/1975 | Naber et al. | 427/95 |

OTHER PUBLICATIONS

Weiffenbach, C. K., et al., *High-Temperature Equilibria from Plasma Sources, I. Carbon-Hydrogen-Oxygen Systems*, In J. Phys. Chem., 73 (8):, pp. 2526–2531, Aug. 1969.

*Primary Examiner*—Cameron K. Weiffenbach
*Attorney, Agent, or Firm*—Craig & Antonelli

[57] ABSTRACT

In a method of doping impurities comprising mixing a carrier gas, a semiconductor compound gas and a doping gas and leading the mixed gas to a reaction chamber to form a semiconductor layer or a semiconductor oxide layer doped with impurities on a substrate inside the chamber, a part of the doping gas before mixing the doping gas with the other gases is taken and led to a gas analyzer and impurity concentration in the doping gas is monitored to control the impurity concentration in the doping gas.

14 Claims, 6 Drawing Figures

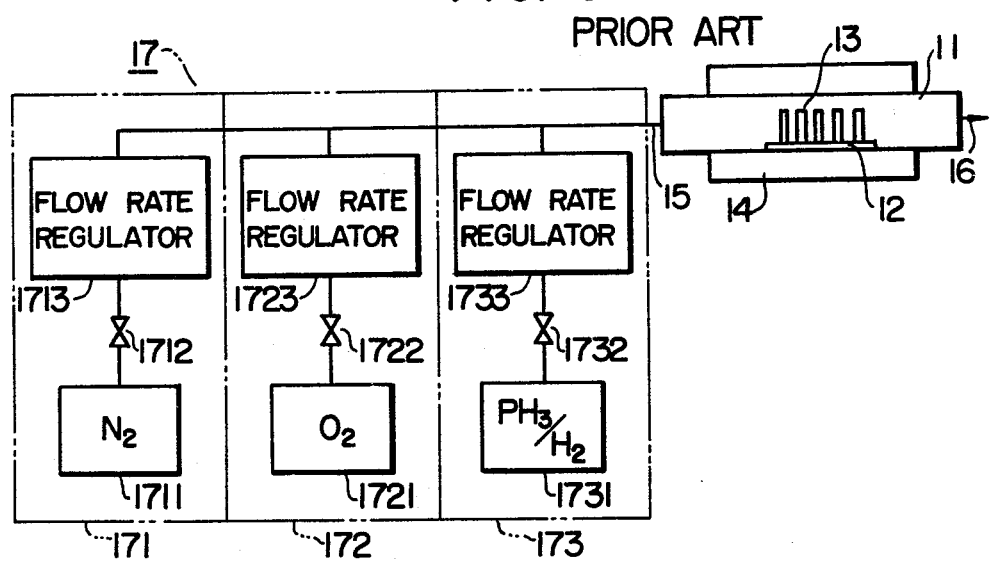
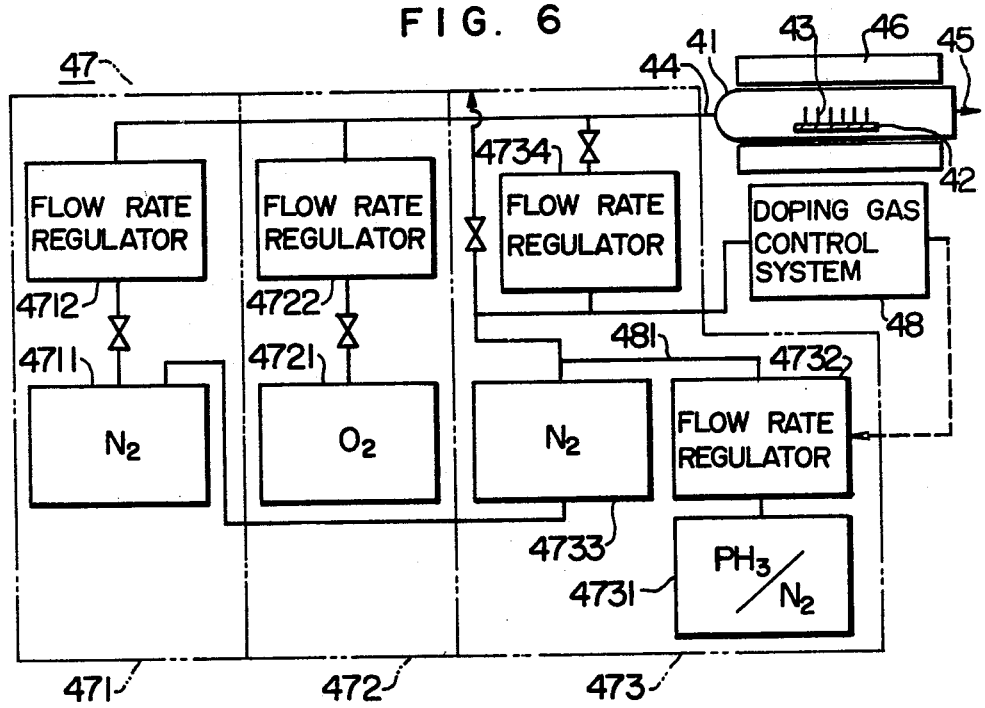

METHOD OF DOPING INPURITIES

FIELD OF THE INVENTION

The invention relates to a method of doping impurities into semiconductors or semiconductor oxides.

BRIEF DESCRIPTION OF THE DROWINGS

FIG. 3 is a block diagram of a prior art vapor-phase diffusion equipment.

FIG. 6 is a block diagram of one example of vapor-phase diffusion equipment to which the invention is applied.

DESCRIPTION OF THE PRIOR ART

Figure 1:
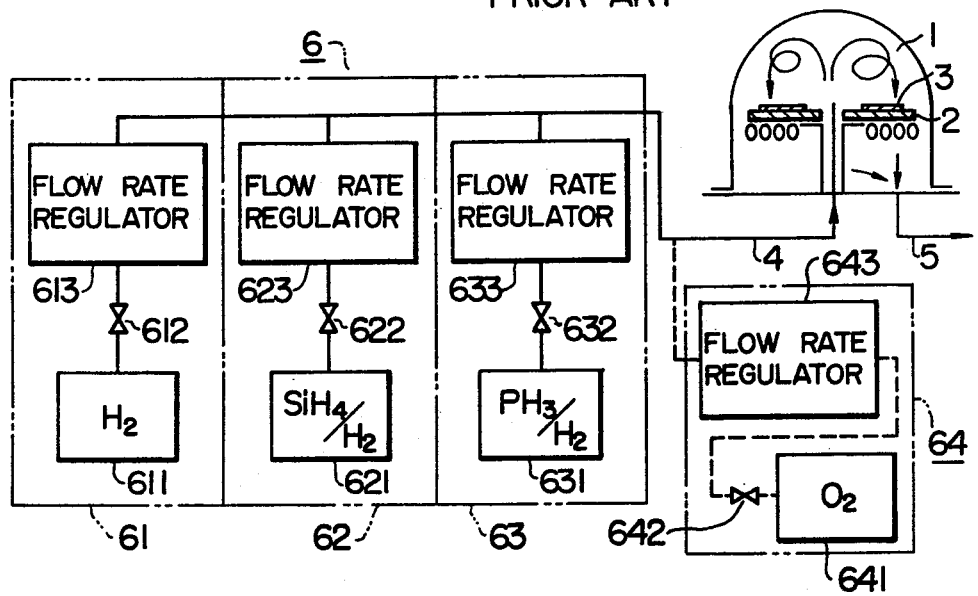
FIG. 1 is a block diagram of a prior art vapor-phase growth equipment.
Figure 2:
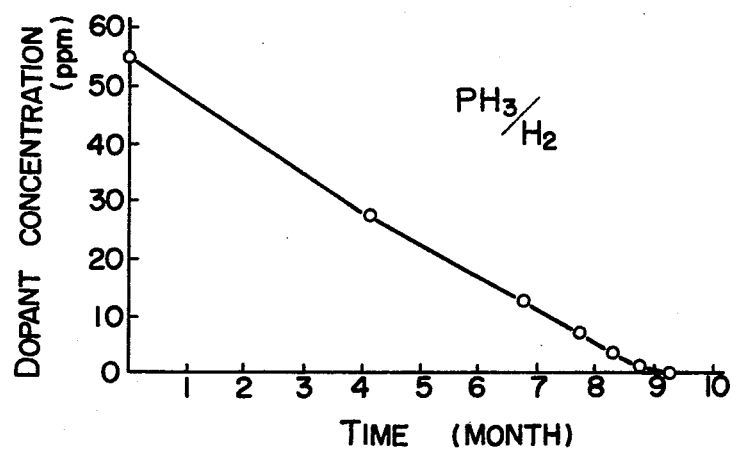
FIG. 2 is a graph showing an example of variation with time in dopant concentration within a doping gas source.

In order that a semiconductor device bears given characteristics, it is necessary for the main part of the device or individual regions within a semiconductor substrate of the device to have a given concentration profile which is determined by the impurity concentration in the individual region and the size thereof. Conventionally, when forming, in a predetermined thickness, a semiconductor layer of vapor-phase growth having a predetermined impurity concentration on a semiconducotr substrate by means of vapor-phase growth process or forming a diffusion layer having a predetermined surface concentration and concentration profile on a semiconductor substrate by means of vapor-phase diffusion process, the following methods have been employed. More particularly, the prior art vapor-phase growth process is performed with an equipment as shown in FIG. 1 of the accompanying drawings. In the figure, reference numeral 1 designates a reaction chamber, 2 a susceptor for carrying a semiconductor substrate 3 inside the reaction chamber 1, 4 a vaporized material feeding pipe communicated with the reaction chamber 1, 5 an exhaust pipe also communicated with the reaction chamber 1, and 6 a vaporized material feeding system led to the feeding pipe 4. The vaporized material feeding system 6 comprises a carrier gas flow path 61 leading from a source 611 of carrier gas, for example, hydrogen gas, to the vaporized material feeding pipe 4 through a first valve 612 and a first gas flow rate regulator 613, a semiconductor compound gas flow path 62 leading from a source 621 of semiconductor compound gas to the vaporized material feeding pipe 4 through a second valve 622 and a second gas flow rate regulator 623, and a doping gas flow path 63 leading from a source 631 of doping gas to the vaporized material feeding pipe 4 through a third valve 632 and a third gas flow rate regulator 633. In the semiconductor compound gas source 621 and the doping gas source 631 are contained for example pressurized monosilane diluted with hydrogen ($SiH_4/H_2$) and pressurized phosphine diluted with hydrogen ($PH_3/H_2$) or diborane diluted with hydrogen ($B_2H_6/H_2$), respectively. Thus, hydrogen, monosilane diluted with hydrogen and doping gas are fed to the reaction chamber 1 at a given percentage and flow rate under the control of the gas flow rate regulators 613, 623 and 633. While the reaction chamber 1 is being filled with hydrogen, monosilane diluted with hydrogen and doping gas passing therethrough, the susceptor 2 is heated for a predetermined period so that a vapor-phase growth layer of silicon having a given conductivity, resistance and thickness is formed on the semiconductor substrate 3. The resistivity of the vapor-phase growth layer thus prepared is controllable by regulating the flow rate of doping gas. The prior art vapor-phase growth process described above, however, is disadvantageous in that the vapor-phase growth layer formed on the semiconductor substrate has poor reproductivity for resistivity and consequently yield rate of semiconductor devices with such vapor-phase growth layer is reduced markedly. In this prior art technique, the percentage and flow rate of various vaporized materials to be fed to the reaction chamber 1, on one hand, are preselected to given values by means of gas flow rate regulators 613, 623 and 633, but the concentration of dopant (impurity) within the doping gas source 631, on the other hand, varies with time as shown in FIG. 2, resulting in the above drawbacks. The rate of this variation is not constant which differs dependent on a specific gas cylinder and gas concenration therein. Therefore, it is difficult to control such variation. To minimize the adverse affect due to the variation in dopant concentration, it is a conventional practice to take a periodic inspection every day or week before the commencement of the process operation. In this inspection, a trial vapor-phase growth is carried out under an invariable doping condition to check for the resistivity of a growth layer. A practical process operation follows the inspection. This inspection consumes an additional working time, considerably reducing the working efficiency. The adverse affect accompanied by the prior art vapor-phase growth technique becomes appreciable as the doping concentration becomes small, that is, the resistivity of growth layer becomes large and in some cases, the intended growth layer cannot be prepared by the prior art technique.

The prior art vapor-phase diffusion process, on the other hand, is performed with an equipment, for example, as shown in FIG. 3. In the figure, numeral 11 designates a reaction chamber, 12 a holder for carrying a semiconductor substrate 13 inside the reaction chamber 11, 14 a furnace, 15 a doping gas feeding pipe connected to the reaction chamber 11, 16 an exhaust pipe also connected to the reaction chamber 11, and 17 a doping gas feeding system. The doping gas feeding system 17 comprises a carrier gas flow path 171 leading from a carrier gas source 1711 to the doping gas feeding pipe 15 through a first valve 1712 and a first gas flow rate regulator 1713, an oxygen gas flow path 172 leading from an oxygen gas source 1721 to the doping gas feeding pipe 15 through a second valve 1722 and a second gas flow rate regulator 1723, and a doping gas flow path 173 leading from a doping gas source 1731 to the doping gas feeding pipe 15 through a third valve 1732 and a third gas flow rate regulator 1733. In the carrier gas source 1711 is contained pressurized nitrogen or argon gas. The doping gas source 1731 is contained with pressurized phosphine diluted with nitrogen ($PH_3/N_2$), pressurized diborane diluted with nitrogen ($P_2H_6/N_2$) or oxychloride phosphor ($POCl_3$) allowed to bubble by the addition of nitrogen. Thus, nitrogen, oxygen and doping gas are fed through the doping gas feeding pipe 15 to the reaction chamber 11 at a given percentage and flow rate under the control of gas flow rate regulators 1713, 1723 and 1733. While the reaction chamber 11, which is heated, is being filled with the doping gas passing therethrough for a predetermined period, a diffusion layer having a given surface concentration and depth is formed in the semiconductor substrate 13. The diffusion layer thus prepared, however, has poor reproductivity for its surface concentration and depth because of the variation with time of the dopant concentration in dopant gas source, just like the vapor-phase growth process.

Additionally, a silicon oxide film doped with phosphor or boron, that is, doped silicon oxide film, is widely used for the production of semiconductor devices as a source of impurity (phosphor, boron) to be diffused into silicon crystalline or a surface protection film for semiconductor devices. The doped silicon oxide film can be prepared with an equipment provided with an oxygen gas flow path 64, blocked in by dotted line, in addition to the vaporized material feeding system 6 of FIG. 1. The oxygen gas flow path 64 leads from an oxygen gas source 641 to the vaporized material feeding pipe 4 through a fourth valve 642 and a fourth gas flow rate regulator 643. The doped silicon oxide film thus prepared also has poor reproductivity for impurity concentration in the film per se.

Further, a polycrystalline semiconductor layer which has a larger resistivity than that of a monocrystalline semiconductor layer is used, for example, as a resistor region of integrated semiconductor devices. Such a polycrystalline semiconductor layer can be prepared with the equipment shown in FIG. 1, but it is again defective in reproductivity for impurity concentration in the layer per se because the equipment used for its preparation is defective.

SUMMARY OF THE INVENTION

An object of the invention is to provide a novel method of doping impurities capable of eliminating disadvantages of conventional impurity doping methods.

Specifically, an object of the invention is to provide a novel impurity doping method assuring high reproductivity for impurity concentration in regions to be doped with impurities.

According to the invention, these objects are attained by providing an impurity doping method characterized by the steps of picking up a part of doping gas in the way of a doping gas flow path and leading the part to a gas analyzer, monitoring impurity concentration in the doping gas, and controlling the impurity concentration in the doping gas. The wording "doping gas flow path" used throughout the specification means as a flow path for the doping gas which leads from a doping gas source to a flow path point just before a location at which the doping gas is mixed with other gases including carrier gas. It will be seen from the foregoing description of the prior art processes that the doping gas usually being diluted with hydrogen gas or inert gas is passed through the doping gas flow path. In this case, the doping gas flow path terminates in a flow path point close to a reaction chamber just before the location at which the doping gas is mixed with other gases including carrier gas.

According to the invention, since the impurity concentration in the doping gas is detected to thereby control the impurity concentration in the doping gas, the following advantages are obtainable:

(1) Irregularity and variation with time of the impurity concentration in doping gas source are eliminated so that the reproductivity for impurity concentration in doping region is improved; and (2) Impurity concentration in the doping gas can be controlled easily and precisely. Namely, comparison of the impurity concentration in the doping gas flow path with that in the mixture gas just before the reaction chamber shows that the former is higher than the latter by 1 to 2 orders and therefore the former can be detected with a gas analyzer and controlled more easily and precisely. It should be noted that, in the case of preparing a growth layer having impurity concentration of $10^{14}$ to $10^{19}$ atoms/cm$^3$ by means of vapor-phase growth process, actual impurity concentration in the doping gas flow path is 1 ppm to 1000 ppm whereas actual impurity concentration in the mixture gas right before the reaction chamber is 0.01 ppm to 10 ppm.

Now, a gas analyzer to be used in this invention will be described. All types of gas analyzers are applicable to the invention and as a rule, some of them are chosen in accordance with the impurity concentration in doping gas. It is advisable that an infrared spectrometer and a mass analyzer are used for measuring impurity concentration of more than 100 ppm. A flame photometric detector, ion chromatograph, photoionization detector and fluorimeter are suitable for the measurement of impurity concentration of less than 100 ppm, for example, in the order of ppb. Because there has hitherto never been an attempt to apply these gas analyzers to the fields of semiconductors, these analyzers will be described in greater detail hereunder.

(1) A flame photomatric detector is a detecting device wherein a molecular emission spectrum characteristic to elements or molecules which is caused by reductive combustion of the molecules in a flame is detected with a photomultiplier and converted into a photoelectric current thereby. Hitherto, the flame photometric detector has been used as a high sensitivity detector which exclusively detects phosphor and sulphur contained in a component separated from the column of gas chromatograph. It was proved by the inventors that the flame photometric detector has practically satisfactory sensitivity and response for the purpose of detecting the concentration of phosphine or diborane in hydrogen gas during vapor-phase growth of silicon. On using the flame photometric detector, care is taken of preventing a gas scheduled to burn within the flame photometric detector from being mixed with semiconductor compound. If a semiconductor compound such as SiH$_4$, SiH$_2$Cl$_2$, SiHCl$_3$ or SiCl$_4$ is mixed with the gas, the gas being burnt in the flame photometric detector creates silicon oxide which in turn is precipitated on the inner wall surface of the combustion tube made of transparent quartz. As a result, the light of flame incident to the photomultiplier is interrupted by the silicon oxide so that the light quantity is reduced, thereby preventing a precise quantitative analysis. In the process of the invention wherein a part of doping gas is picked up in the way of the doping gas flow path and led to a gas analyzer, the above drawbacks are eliminated and proper use is made of the flame photometric detector.

(2) An ion chromatograph is an analyzer wherein cluster ions of water are created from gas containing humidity by corona discharge, these ions are caused by electric field to collide with impurities contained in the sample gas to be measured thereby the impurities being ionized, and the magnitude of ion current is measured to determine the impurity concentration to be measured. It was proved that the ion chromatograph also has satisfactory sensitivity and response for the purpose of detecting the concentration of phosphine or diborane contained in carrier gas during vapor-phase growth of silicon. Like the flame photometric detector, with the creation of silicon oxide and chloride gas due to mixing up of semiconductor compound with the carrier gas in the detecting unit, the ion chromatograph encounters corrosion and degraded measurement accuracy. The invention eliminates such disadvantages.

(3) In a photoionization detector, a high energy source created by glow discharge of the gas is used as an excitation light source, light from the excitation source is impinged upon the sample gas containing impurities to be measured thereby the impurities being ionized, and the magnitude of ion current is measured to determine the concentration of the impurities contained in the sample gas. It was also proved that the photoionization detector has satisfactory sensitivity for the purpose of detecting the concentration of phosphine or diborane in the carrier gas during the vapor-phase growth. This detector encounters the same problems as the former detector does but the invention solves those problems.

(4) In a fluorometer, external ultraviolet ray is impinged upon sample gas containing a slight amount of fluorescent impurities to be measured, the intensity of fluorescence caused thereby is detected with a photomultiplier to determine the concentration of impurities. With excitation light sources of 1600 A to 2300 A ultraviolet ray for phosphine and of 1700 A to 2000 A ultraviolet ray for diborane, the fluorometer was proved to be capable of measuring the concentration of a slight amount of fluorescent impurities contained in the carrier gas during the vapor-phase growth. Since this detector is free from the creation of the adverse substance and the light interruption and corrosion caused thereby in contrast with the former detectors and has high sensitivity, the invention can be realized effectively with this detector.

DESCRIPTION OF THE PREFERRED EMBODIMENTS

An impurity doping method of the invention will be described in greater detail by way of examples.

EXAMPLE I

Figure 4:
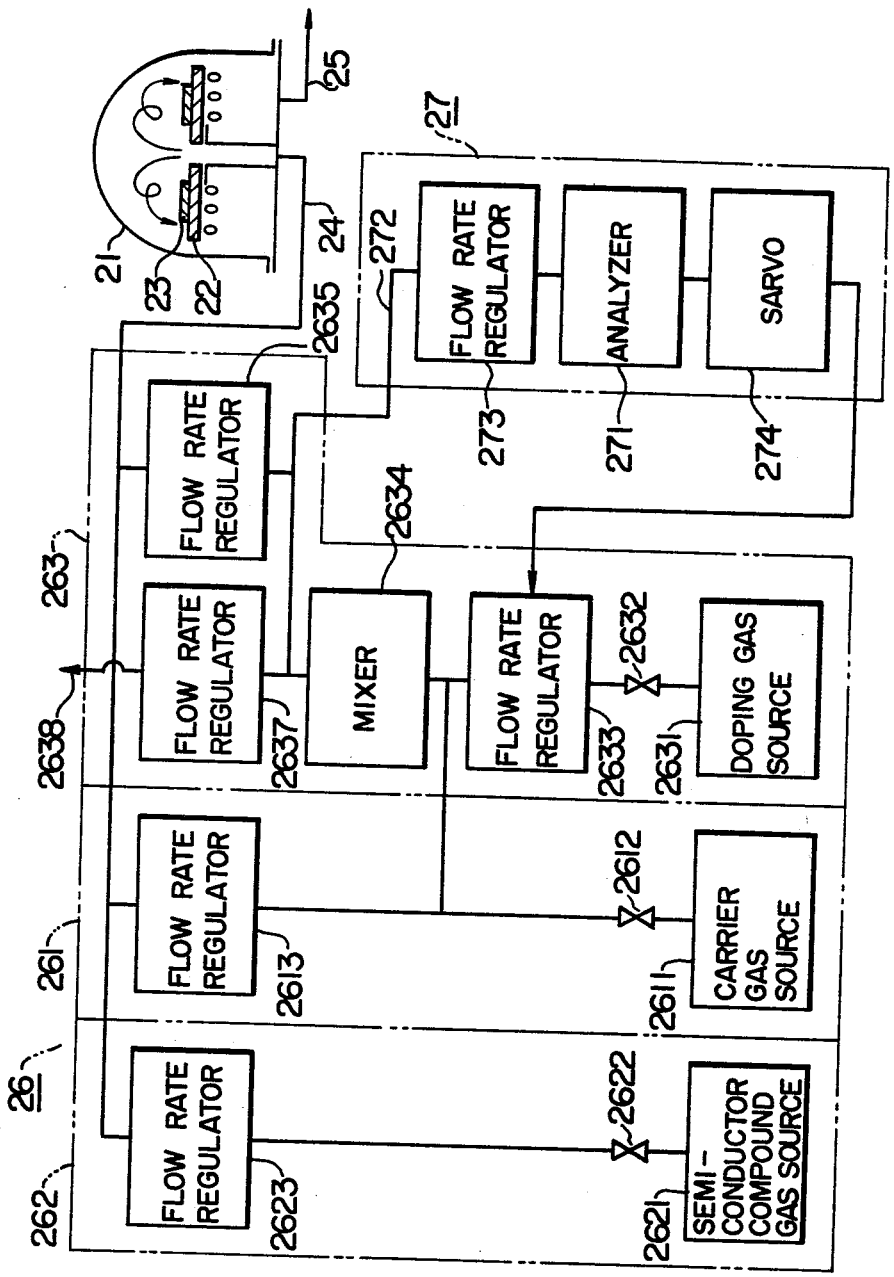
FIG. 4 is a block diagram of one example of vapor-phase growth equipment to which the invention is applied.

As shown in FIG. 4, an equipment for vapor-phase growth applicable to the invention comprises a reaction chamber 21, a susceptor 22 for carrying a semiconductor substrate 23 inside the reaction chamber 21, a vaporized material feeding pipe 24 communicated with the reaction chamber 21, an exhaust pipe 25 also communicated with the reaction chamber 21, and a vaporized material feeding system 26 communicated with the vaporized material feeding pipe 24. The vaporized material feeding system 26 comprises a carrier gas flow path 261 leading from a carrier gas source 2611 to the vaporized material feeding pipe 24 through a first valve 2612 and a first gas flow rate regulator 2613, a semiconductor compound gas flow path 262 leading from a semiconductor compound gas source 2621 to the vaporized material feeding pipe 24 through a second valve 2622 and a second gas flow rate regulator 2623, and a doping gas flow path 263 leading from a doping gas source 2631 to the vaporized material feeding pipe 24 through a third valve 2632, a third gas flow rate regulator 2633, a gas mixer 2634 and a fourth gas flow rate regulator 2635. Numeral 2636 designates a conduit provided for assuring the dilution of doping gas with carrier gas and interposed between a juncture of the third gas flow rate regulator 2633 and the gas mixer 2634 inserted in the doping gas flow path 263 and a juncture of the first valve 2612 and the first gas flow rate regulator 2613 inserted in the carrier gas flow path 261, and 2637 a fifth gas flow rate regulator provided for exhausting a predetermined amount of doping gas and communicated with an exhaustion pipe 2638 which branches from a conduit interposed between the gas mixer 2634 and the fourth gas flow rate regulator 2635. The conduit 2636 and the fifth gas flow rate regulator participate in controlling the impurity concentration in the doping gas such that it is lowered. A doping gas control system generally designated at 27 and communicated with the doping gas flow path 263 comprises a gas analyzer 271, a gas pick-up conduit 272 which connects the conduit interposed between the gas mixer 2634 and fourth gas flow rate regulator 2635 to the gas analyzer 271, a gas flow rate regulator 273 inserted in the gas pick-up conduit 272, and a sarvo unit 274 for actuating the third gas flow rate regulator 2633 in response to an output signal from the gas analyzer 271. A gas flow rate regulator used herein is of an automatic type which automatically corrects variation in the flow rate due to variation in feeding gas pressure prevailing in the gas flow path so that the gas flow rate may be kept constant at a set value.

In forming a vapor-phase growth layer with the vapor-phase growth equipment of this construction, a mixture gas resulting from mixing carrier gas from the carrier gas flow path 261 with semiconductor compound gas from the semiconductor compound gas flow path 262 and doping gas from the doping gas flow path 263 as well is fed to the reaction chamber 21 heated at a high temperature. On the other hand, a part of the doping gas is led to the gas analyzer 271 through the gas pick-up conduit 272 and gas flow rate regulator 273, and impurity concentration in the part is measured. The measured impurity concentration is converted into an electric signal which in turn is compared with an electric reference signal corresponding to an intended concentration of the growth layer so as to produce an electric signal which actuates by way of the servo unit 274 the third gas flow rate regulator 2633 such that the impurity concentration within doping gas is maintained at the predetermined value. Namely, the impurity concentration in doping gas is controlled to be constant. In this manner, a growth layer is prepared the resistivity (impurity concentration) of which is controlled precisely to an intended value.

Next, irregularity in the impurity concentration of vapor-phase layer prepared with the equipment of the invention is compared with that of the prior art equipment shown in FIG. 1. For the first comparison, three types of N-conductivity type layers each intended to have a different impurity concentration of $1 \times 10^{14}$ atoms/cm$^3$, $1 \times 10^{15}$ atoms/cm$^3$ and $2 \times 10^{16}$ atoms/cm$^3$ were prepared repeatedly in a disorderly manner by feeding to the reaction chamber heated at 1150° C the carrier gas of hydrogen, semiconductor compound gas of monosilane and doping gas of a mixture of phosphine diluted with hydrogen. The thickness of each layer was 20 μm, the growth rate was 1.1

μm/min., and fifteen growths were performed within two weeks. A flame photometric detector was used as gas analyzer 271. Experimental results were ± 37% irregularity for $1 \times 10^{15}$ atoms/cm$^3$ concentration with the prior art equipment shown in FIG. 1 whereas ± 10% irregularity for the same concentration with the equipment shown in FIG. 4. As will be seen from these results, the irregularity in concentration in the growth layer is improved by about ¼ according to the invention in comparison with the prior art technique, together with high reproductivity of the impurity concentration. For the second comparison, the vapor-phase growth was performed under the same growth condition every five months, and the variation in the impurity concentration in growth layer was examined. Nature of carrier gas, semiconductor compound gas and doping gas and the growth condition as well were retained the same as the first comparison. For an intended impurity concentration of $1 \times 10^{16}$ atoms/cm$^3$, experimental results were $5 \times 10^{15}$ atoms/cm$^3$ concentration after fifth month vapor-phase growth with the prior art equipment whereas $1 \times 10^{16}$ atoms/cm$^3$ concentration with the equipment of the invention. This shows that the invention is immune to such variation with time in the concentration within the doping gas source as shown in FIG. 2 and permits the highly reproducible preparation of a growth layer of an intended concentration without fail.

EXAMPLE II

With the equipment shown in FIG. 4, it is possible to prepare a polycrystalline semiconductor layer doped with impurities with high reproductivity. Briefly, this is done by a vapor-phase reaction at a relatively low temperature range from 600° to 900° C with the same vaporized material as the process for forming monocrystalline layers uses. Preferably, a monocrystalline substrate usually coated with an oxide film and doping gas of diborane are employed. The procedure of growth will be described specifically. Carrier gas of hydrogen, semiconductor compound gas of monosilane and doping gas of diborane diluted with hydrogen are prepared. Within the reaction chamber 21 is placed a silicon monocrystalline substrate coated with a 0.1 μm to 1 μm thickness silicon thermal oxide film, the substrate being maintained at a temperature from 600° to 900° C. Then, by feeding to and passing through the reaction chamber 21 a mixture gas of hydrogen gas, monosilane gas and diborane gas, a silicon polycrystalline layer of P-conductivity type is formed on the substrate. The impurity concentration in this silicon polycrystalline layer has also been controlled precisely to a predetermined value, like in the process for monocrystalline layer, by actuating the doping gas control system.

EXAMPLE III

Figure 5:
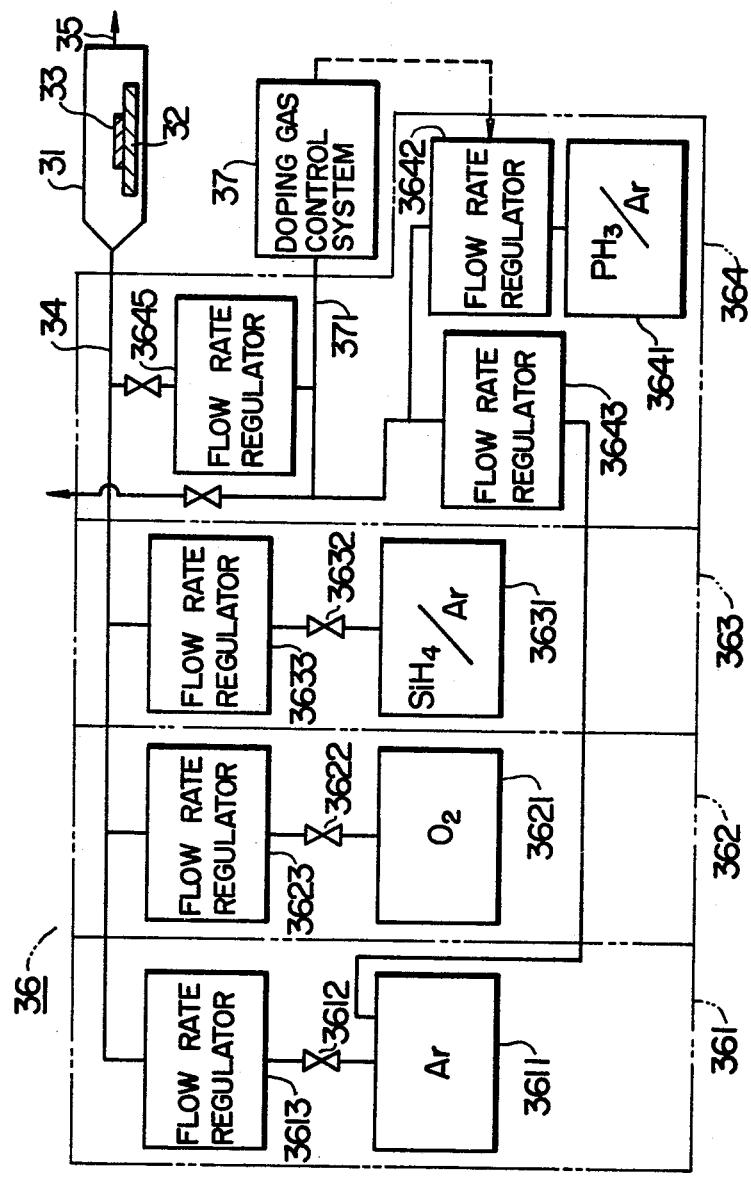
FIG. 5 is a block diagram of one example of equipment for forming a doped silicon oxide film to which the invention is applied.

FIG. 5 shows an equipment for forming a doped silicon oxide film in accordance with the invention.

A silicon wafer 33 is placed on a heating block 32 within a reaction chamber 31. Connected with the reaction chamber 31 are a reaction gas feeding pipe 34 and an exhaust pipe 35. A reaction gas feeding system 36 comprises an argon gas feeding path 361 leading from a source 3611 of carrier gas for example argon, to the reaction gas feeding pipe 34 through a first valve 3612 and a first gas flow rate regulator 3613, an oxygen gas feeding path 362 leading from an oxygen ($O_2$) gas source 3621 to the reaction gas feeding pipe 34 through a second valve 3622 and a second gas flow rate regulator 3623, a monosilane gas feeding path 363 leading from a source 3631 of monosilane diluted with argon gas to the reaction gas feeding pipe 34 through a third valve 3632 and a third gas flow rate regulator 3633, a source 3641 of dopant gas of phosphine ($PH_3$) diluted with argon, fourth and fifth gas flow rate regulators 3642 and 3643 participating in the dilution at a constant ratio of the dopant gas (the fifth gas flow rate regulator 3643 being connected to the argon gas source 3611), and a doping gas flow path 364 through which a part of the diluted doping gas is fed to the reaction gas feeding pipe 34 under regulation by a sixth gas flow rate regulator 3645. Reference numeral 37 designates a doping gas control system communicated with a branch conduit 371 branching from an intermediate location, for example right before the gas flow rate regulator 3645, of the path for the diluted doping gas. The doping gas system has the same arrangement as that of FIG. 4.

With this equipment, the wafer 33 is heated at 350° C, for example, argon carrier gas flowing through the gas flow rate regulator 3613 is mixed with oxygen, monosilane and phosphine gases respectively regulated to have a constant flow rate under the control of gas flow rate regulators 3623, 3633 and 3645, and a resultant mixture gas is fed to the reaction chamber 31. At this time, the concentration of phosphine doping gas is measured and monitored with the doping gas control system 37, like the foregoing examples, so that it is controlled to a predetermined value with accuracy. As a result, for example, 0.5 μm thickness silicon oxide film ($SiO_2$) precisely containing an intended amount of phosphor can be prepared. The oxide film (doped silicon oxide) of highly reproducible phosphor concentration controlled to a predetermine value is used particularly as a source of phosphor to be diffused into a silicon crystalline, assuring highly precise and reproducible diffusion in comparison with a prior art source.

EXAMPLE IV

FIG. 6 shows a vapor-phase diffusion equipment in accordance with the invention.

A quartz holder 42 mounted thereon with aligned silicon wafers 43 is inserted into a quartz tube 41. The quartz tube 41 is connected with a gas feeding pipe 44 and an exhaust pipe 45. The wafers is heated with an external resistor heating unit 46. An ambient gas feeding system 47 comprises a nitrogen gas feeding path 471 leading from a source 4711 of carrier gas, for example nitrogen gas ($N_2$), to the gas feeding pipe 44 through a gas flow rate regulator 4712, an oxygen gas feeding path 472 leading from an oxygen gas ($O_2$) source 4721 to the gas feeding pipe 44 through a gas flow rate regulator 4722, a dopant gas source 4731 of phosphine ($PH_3$) diluted with nitrogen, nitrogen gas flow rate regulators 4732 and 4733 participating in dilution at a constant ratio of the dopant gas, and a doping gas flow path 473 through which a part of the diluted doping gas is fed to the gas feeding pipe 44 under the control of a gas flow rate regulator 4734. Reference numeral 48 designates a diping gas control system communicated with a branch conduit 481 branching from an intermediate location, for example right before the gas flow rate regulator 4734, of the path for the diluted doping gas. The doping gas control system has the same construction as that of FIG. 4.

With the vapor-phase diffusion equipment, the wafer 43 is heated up to 1000° C, for example, in an embodiment of nitrogen gas flowing under the control of the gas flow rate regulator 4712. When the temperature reaches a scheduled value, under maintenance of the flow rate of the nitrogen gas at a constant value, oxygen gas at a constant flow rate and phosphine doping gas at a constant concentration and flow rate are fed simultaneously to the diffusion furnace 41 respectively through the gas flow rate regulators 4722 and 4734. The phosphine doping gas is measured and monitored with a flame photometric detector, for example, like the foregoing examples, and its concentration is directly and precisely controlled to a predetermined value under the control of gas flow rate regulators 4732 and 4733 so that a diffusion layer of phosphor having precisely reproducible and controllable depth and surface concentration can be prepared after a predetermined time has elapsed.

We claim:

1. In a method of doping an impurity wherein carrier gas from a carrier gas flow path, a semiconductor compound gas from a semiconductor compound gas flow path and a doping gas containing an impurity from a doping gas flow path are mixed up and led to a reaction chamber maintained at a high temperature to form a semiconductor layer doped with a predetermined impurity concentration on a substrate disposed within the reaction chamber, the improvement comprising the steps of picking up a part of said doping gas in said doping gas flow path prior to mixing of said doping gas with said semiconductor compound gas and said carrier gas and leading the part to a gas analyzer, monitoring the impurity concentration in said doping gas, and controlling the impurity concentration in said doping gas to a predetermined value sufficient to produce said semiconductor layer having said predetermined concentration.

2. A method according to claim 1, wherein said gas analyzer comprises a flame photometric detector.

3. A method according to claim 1, wherein the impurity concentration in the doping gas flowing through said doping gas flow path is less than 100 ppm, and said gas analyzer comprises a flame photometric detector.

4. A method according to claim 1, wherein said impurity concentration in said doping gas is controlled to be constant.

5. A method according to claim 1, wherein the impurity concentration in the doping gas flowing through said doping gas flow path is less than 100 ppm and said gas analyzer comprises an ion chromatograph.

6. A method according to claim 1, wherein the impurity concentration in the doping gas flowing through said doping gas flow path is less than 100 ppm and said gas analyzer comprises a photoionization detector.

7. A method according to claim 1, wherein the impurity concentration in the doping gas flowing through said doping gas flow path is less than 100 ppm and said gas analyzer comprises a fluorometer.

8. In a method of doping an impurity wherein a carrier gas from a carrier gas flow path and a doping gas containing an impurity from a doping gas flow path are mixed up and led to a reaction chamber maintained at a high temperature to form an impurity diffused layer doped with a predetermined impurity concentration in a substrate disposed within the reaction chamber, the improvement comprising the steps of picking up a part of said doping gas in said doping gas flow path prior to mixing of said doping gas with said carrier gas and leading the part to a gas analyzer, monitoring impurity concentration in said doping gas, and controlling the impurity concentration in said doping gas to a predetermined value sufficient to produce said impurity-diffused layer having said predetermined concentration.

9. A method according to claim 8, wherein the impurity concentration in said doping gas is controlled to be constant.

10. In a method of doping an impurity wherein a carrier gas from a carrier gas flow path, a semiconductor compound gas from a semiconductor compound gas flow path, an oxygen gas from an oxygen gas flow path and a doping gas containing an impurity from a doping gas flow path are mixed up and led to a reaction chamber maintained at a high temperature to form a layer of oxide of a semiconductor doped with a predetermined impurity concentration on a substrate disposed within the reaction chamber, the improvement comprising the steps of picking up a part of said doping gas in said doping gas flow path prior to mixing of said doping gas with said semiconductor compound gas, said oxygen gas and said carrier gas and leading the part to a gas analyzer, monitoring the impurity concentration in said doping gas, and controlling the impurity concentration in said doping gas to a predetermined value sufficient to provide said layer of oxide of a semiconductor having said predetermined concentration.

11. A method of applying an adjusted amount of impurity to a substrate to form an impurity doped region, comprising a combination of:

the step of introducing a gas mixture containing a doping impurity gas diluted and carried by a carrier gas, through a main path into a heated reaction chamber having the substrate disposed therewithin, thereby to form an impurity doped region having a predetermined impurity concentration; and a step of picking up a part of said gas mixture from said main path prior to the introduction of said gas mixture into said reaction chamber and leading the picked-up part of said gas mixture through a by-path to a gas analyzer to monitor the impurity concentration in the picked-up part of said gas mixture so that the amount of the impurity in said gas mixture through said main path is adjusted, with respect to the amount of said carrier gas and in response to an output signal from said gas analyzer, to a value sufficient to provide said impurity doped region having said predetermined impurity concentration.

12. A method according to claim 11, wherein said impurity doped region is formed in said substrate through the diffusion of the impurity.

13. A method according to claim 11, wherein said gas mixture further contains a semiconductor compound gas, the adjustment of the amount of the impurity in said gas mixture is made with respect to the amounts of said carrier gas and said semiconductor compound gas in said gas mixture, and a semiconductor layer is formed as said impurity doped region on said substrate.

14. A method according to claim 11, wherein said gas mixture further contains a semiconductor compound gas and an oxygen gas, the adjustment of the amount of the impurity in said gas mixture is made with respect to the amounts of said carrier gas, said semiconductor compound gas and said oxygen gas in said gas mixture and a layer of oxide of a semiconductor is formed as said impurity doped region on said substrate.

* * * * *